United States Patent
Ahmed et al.

(10) Patent No.: US 8,373,406 B2
(45) Date of Patent: Feb. 12, 2013

(54) ELECTRICAL POWER QUALITY TEST CIRCUITRY AND METHOD

(75) Inventors: Ahmed Mohamed Sayed Ahmed, Mequon, WI (US); Gary L. Skibinski, Milwaukee, WI (US); Richard A. Lukaszewski, New Berlin, WI (US)

(73) Assignee: Rockwell Automation Technologies, Inc., Mayfield Heights, OH (US)

( * ) Notice: Subject to any disclaimer, the term of this patent is extended or adjusted under 35 U.S.C. 154(b) by 757 days.

(21) Appl. No.: 12/512,205

(22) Filed: Jul. 30, 2009

(65) Prior Publication Data
US 2011/0025300 A1    Feb. 3, 2011

(51) Int. Cl.
*G01R 19/22* (2006.01)
(52) U.S. Cl. ...................................................... 324/119
(58) Field of Classification Search ............. 324/764.01, 324/762.01–762.1, 426, 436, 430, 119–120; 702/118
See application file for complete search history.

(56) References Cited

U.S. PATENT DOCUMENTS

| | | | | |
|---|---|---|---|---|
| 4,937,720 | A * | 6/1990 | Kirchberg | 363/41 |
| 5,055,992 | A * | 10/1991 | Cook | 363/98 |
| 5,886,429 | A | 3/1999 | Grady et al. | |
| 5,920,132 | A | 7/1999 | Rockfield, Jr. et al. | |
| 6,285,169 | B1 | 9/2001 | McEachern | |
| 6,759,765 | B2 | 7/2004 | McEachern et al. | |
| 7,994,798 | B2 * | 8/2011 | Williams et al. | 324/537 |
| 2004/0012381 | A1 * | 1/2004 | Hachisuka et al. | 324/117 R |

\* cited by examiner

*Primary Examiner* — Tung X Nguyen
(74) *Attorney, Agent, or Firm* — Fletcher Yoder, P.C.; Alexander R. Kuszewski; John M. Miller

(57) ABSTRACT

Electrical power quality test circuitry for testing response of an electrical device to input power disturbances is provided. The test circuitry includes a power structure having a rectifier configured to convert incoming AC voltage to DC voltage on a DC bus, and a power inverter configured to convert DC voltage from the bus to three-phase output AC voltage applied to the electrical device. The test circuitry also includes a control circuit configured to apply control signals to at least the power inverter to emulate at least one of a change in the amplitude of at least one phase of the output AC voltage at least one phase angle of at least one phase of the output AC voltage, and a frequency change for all phases of the output AC voltage.

23 Claims, 4 Drawing Sheets

ELECTRICAL POWER QUALITY TEST CIRCUITRY AND METHOD

BACKGROUND

The present invention relates generally to electrical devices, and particularly to electrical power quality test circuitry for testing response of such devices to alternating power disturbances. This invention may be employed to test response of a variety of electrical devices such as controllers and equipment in industrial facilities, semiconductor tools, HVAC and so forth. In addition, this invention may be employed to provide high voltage testing of electrical devices such as control transformers, power supplies, control relays, etc.

Various electrical devices, such as those employed in industrial applications, are susceptible to malfunction or damage due to input power disturbances. For example, input power disturbances such as voltage sags and frequency disturbances may affect performance of the electrical devices and may reduce process productivity of applications where such devices are employed. Typically, electrical devices are tested with respect to utility power line disturbances such as variations in input voltage magnitude and duration. Further, several international standards have stipulated test procedures to qualify and accredit the electrical devices with respect to pre-defined test conditions.

Certain systems employ transformer-based test fixtures to emulate three-phase voltage dips, short interruptions and voltage variations for the electrical devices. For example, switching devices are employed in such fixtures to change the voltage through taps of the transformer. However, these test fixtures can only emulate voltage sags/swells, but cannot emulate frequency disturbances or grid harmonics. In addition, these systems are limited to discrete steps in voltage sags Certain other systems employ amplifier-based test fixtures that include electronic power amplifiers connected to a signal generator. These signal generators are based on electronic circuits that may be able to generate various power disturbances but their power capability is generally limited and cannot provide the equipment under test with enough inrush current. As a result, such test may lead to misleading results.

Unfortunately, the transformer-based fixtures are unable to emulate certain power disturbances such as frequency changes, angle jumps, distorted grid voltage that include higher order time harmonics which are common in electrical devices. Furthermore, electronic amplifier based circuits have limited current capability.

Accordingly, it would be desirable to develop an integrated testing tool for testing response of electrical devices for a variety of power disturbances while meeting requirements of testing standards for such devices that require testing devices to provide the equipment under test with high inrush current.

BRIEF DESCRIPTION

Briefly, according to one embodiment of the present invention, electrical power quality test circuitry for testing response of an electrical device to input power disturbances is provided. The test circuitry includes a power structure having a rectifier configured to convert incoming AC voltage to DC voltage on a DC bus, and a power inverter configured to convert DC voltage from the bus to three-phase output AC voltage applied to the electrical device under test. The test circuitry also includes a control circuit configured to apply control signals to at least the power inverter to emulate at least one of a change in voltage amplitude of at least one phase of the output AC voltage, at least one phase angle of at least one phase of the output AC voltage, and a frequency change for all phases of the output AC voltage.

In accordance with another aspect, a method for testing response of an electrical device to input power disturbances is provided. The method includes operating a power structure to convert incoming AC voltage to DC voltage and to convert the DC voltage to three-phase output AC voltage. The method also includes controlling at least a power inverter of the power structure and two additional three phase static switches to emulate at least one of a change in voltage amplitude of at least one phase of the output AC voltage, at least one phase angle of at least one phase of the output AC voltage, and a frequency change for all phases of the output AC voltage.

In accordance with another aspect, electrical power quality test circuitry for testing response of an electrical device to input power disturbances is provided. The test circuitry includes a power structure having a rectifier configured to convert incoming AC voltage to DC voltage on a DC bus, and a power inverter configured to convert DC voltage from the bus to three-phase output AC voltage that is applied to the electrical device under test. The test circuitry also includes an operator interface configured to provide user inputs corresponding to the input power disturbances and a control circuit configured to generate control signals based upon the user inputs and to apply control signals to at least one of the power inverter and to the rectifier to emulate the power disturbances and/or to apply regenerated power back to a power source.

DRAWINGS

These and other features, aspects, and advantages of the present invention will become better understood when the following detailed description is read with reference to the accompanying drawings in which like characters represent like parts throughout the drawings, wherein.

DETAILED DESCRIPTION

As discussed in detail below, embodiments of the present technique function to provide electrical power quality test circuitry for testing response of an electronic equipment to input power disturbances. In particular, the present technique utilizes a power structure for testing electronic device with respect to power disturbances such as voltage sags and frequency disturbances.

References in the specification to "one embodiment", "an embodiment", "an exemplary embodiment", indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

Figure 1:
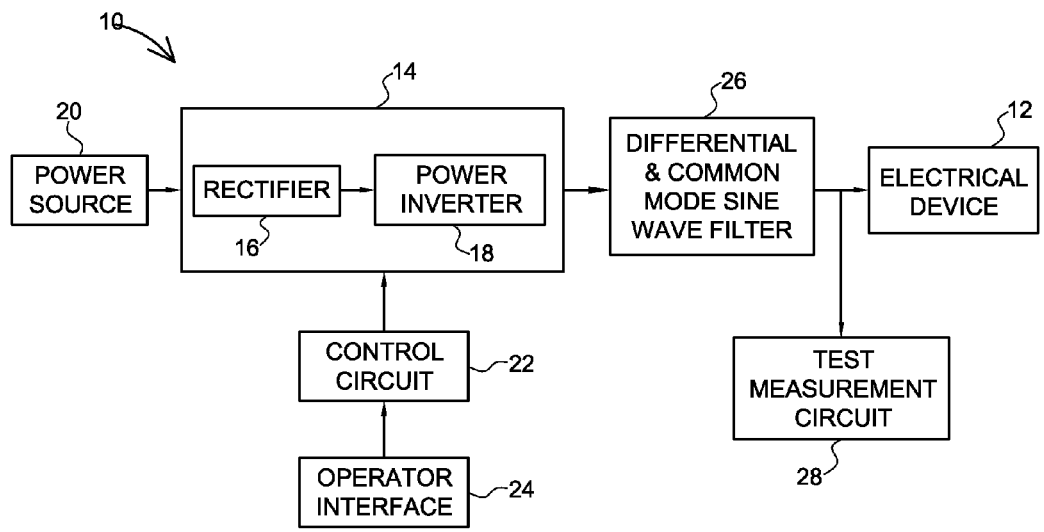
FIG. 1 illustrates electrical power quality test circuitry for testing response of an electrical device in accordance with aspects of the present invention.

Turning now to drawings and referring first to FIG. 1, electrical power quality test circuitry 10 for testing response of an electrical device 12 is illustrated. The test circuitry 10 is configured to test response of the electrical device 12 with respect to input power disturbances such as power interruptions, voltage changes and frequency changes. In one exemplary embodiment, the electrical device 12 includes an AC drive. However, the test circuitry 10 may be employed to test response of a variety of electrical devices such as controllers and equipment in industrial facilities, such as semiconductor tools, HVAC and so forth.

As illustrated, the test circuitry 10 includes a power structure 14 having a rectifier 16 and a power inverter 18. The rectifier 16 is configured to convert incoming AC voltage from a power source 20 to DC voltage on a DC bus. Further, the power inverter 18 is configured to convert DC voltage from the bus to three-phase output AC voltage applied to the electrical device 12. In the illustrated embodiment, the test circuitry 10 further includes a control circuit 22 configured to apply control signals to the power structure 14 to emulate the input power disturbances. In one exemplary embodiment, the control circuit 22 applies control signals to at least the power inverter 18 to emulate at least one of a change in voltage amplitude of at least one phase of the output AC voltage, at least one phase angle of at least one phase of the output AC voltage, and a frequency change for all phases of the output AC voltage.

In the illustrated embodiment, the test circuitry 10 includes an operator interface 24 configured to provide user inputs for generating the control signals for the power structure 14. An operator (not shown) of the test circuitry may provide a plurality of user inputs corresponding to a desired input power disturbance. Examples of such inputs include a type of the input power disturbance and its magnitude, its onset time and the duration of the input power disturbance. Moreover, the test circuitry 10 includes an integrated differential and common mode sine wave filter 26 that filters higher order harmonics that are associated with the inverter switching action from the output AC voltage. A test measurement circuit 28 is employed to measure currents and/or voltages of the three-phase output AC power. In certain embodiments, the test measurement circuit 28 may include a plurality of sensors (not shown) disposed downstream of the integrated sinewave differential mode and common mode filter 26 to measure the desired currents and/or voltages.

Figure 2:
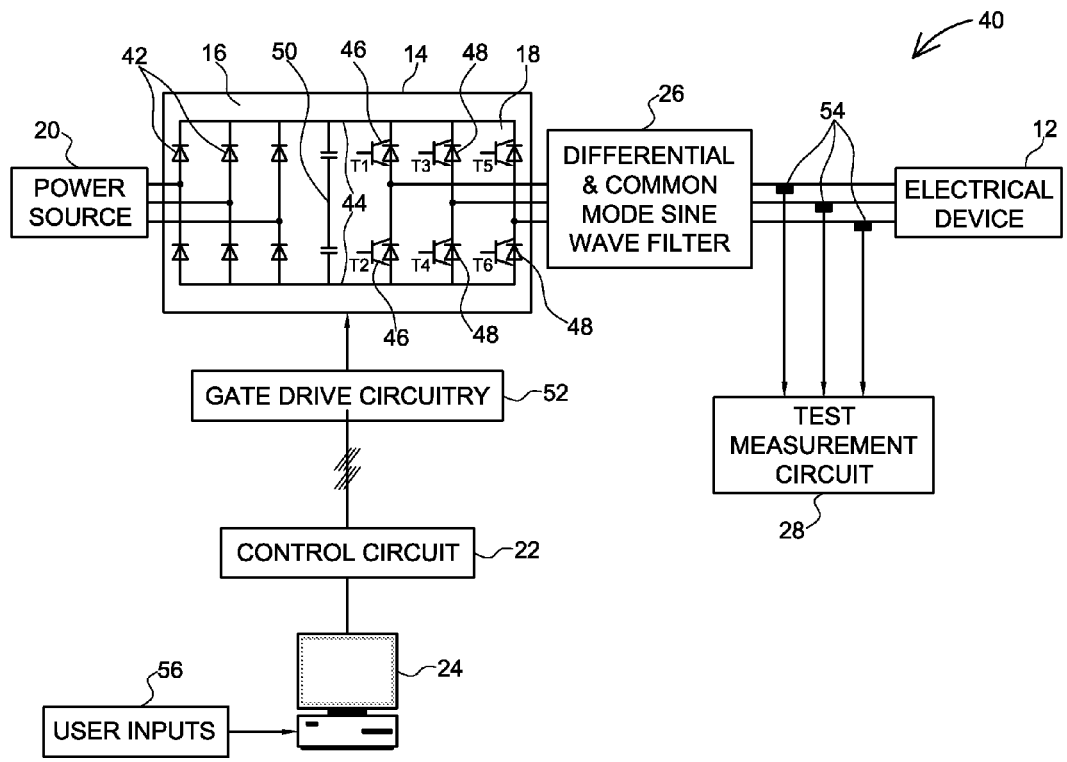
FIG. 2 illustrates an exemplary configuration of the test circuitry of FIG. 1 in accordance with aspects of the present invention.

FIG. 2 illustrates an exemplary configuration 40 of the test circuitry of FIG. 1. In the illustrated embodiment, the power structure 14 includes the rectifier 16 defined by a series of diodes such as represented by reference numeral 42. The diode array converts incoming AC voltage from the power source 20 to DC voltage on a DC bus 44. Moreover, the power structure 14 includes the power inverter 18 formed by an array of solid-state switches 46 and associated diodes 48 to convert DC voltage from the bus 44 to three-phase output AC voltage that is applied to the electrical device 12. As will be appreciated by one skilled in the art, the switches 46 may include any suitable power electronic devices such as insulated gate bipolar transistors. It should be noted that a range of other components may be included in the test circuitry 40 illustrated in FIG. 2. For example, a capacitive circuit 50 may be coupled across the DC bus 44.

The control circuit 22 is configured to apply control signals to the power structure 14 to emulate grid disturbances. In this exemplary embodiment, gate drive circuitry 52 is configured to apply the control signals to the plurality of solid-state switches 46 of the power inverter 18. In this exemplary embodiment, the control circuit 22 applies control signals to the switches 46 to emulate at least one of a change in the amplitude of at least one phase of the output AC voltage, at least one phase angle of at least one phase of the output AC voltage, and a frequency change for all phases of the output AC voltage.

For example, the switches 46 may be controlled to emulate a phase-to-neutral voltage swell or a phase-to-neutral voltage sag. In another exemplary embodiment, the control circuit 22 applies control signals to the switches 46 to emulate a phase-to-phase voltage sag. In certain other embodiments, the control circuit 22 applies control signals to the switches 46 to emulate an unbalance in the voltage applied to the electrical device under test 12. Further, the control circuit 22 is further configured to apply control signals to the switches 46 to emulate a negative sequence output AC voltage. In another exemplary embodiment, the control circuit 22 applies control signals to the switches 46 to emulate a distortion in the grid voltage by adding low order time harmonics to the fundamental harmonic component of the voltage applied to the electrical device under test 12. Thus, a plurality of input power disturbances may be emulated by controlling at least the power inverter 18 of the power structure 14 of the test circuitry 10.

As illustrated, the filter 26 filters high frequencies associated with the switching action of the power inverter 18. Moreover, the test measurement circuit 28 is employed to measure currents and/or voltages of the three-phase output AC power to the electrical device 12. In the illustrated embodiment, the test measurement circuit 28 receives measured currents and/or voltages from a plurality of sensors, such as represented by reference numeral 54 disposed downstream of the filter 26. In certain embodiments, the control circuit 22 generates the control signals based upon the measured currents and/or voltages and a desired input power disturbance.

In the illustrated embodiment, the test circuitry 40 includes the operator interface 24 to provide user inputs 56 corresponding to desired power disturbances for generating the control signals for the power structure 14. In certain embodiments, user inputs 56 may include a change in voltage amplitude of at least one phase of the output AC voltage, a magnitude of at least one phase angle of at least one phase of the output AC voltage, a frequency change for all phases of the output AC voltage, a duration of a voltage sag/surge condition and so forth. The operating conditions of the switches 46 may be controlled by the control circuit 22 based upon such inputs. For example, opening/closing of the switches 46 and the switching time of the switches 46 may be controlled based upon the user inputs 56.

Figure 3:
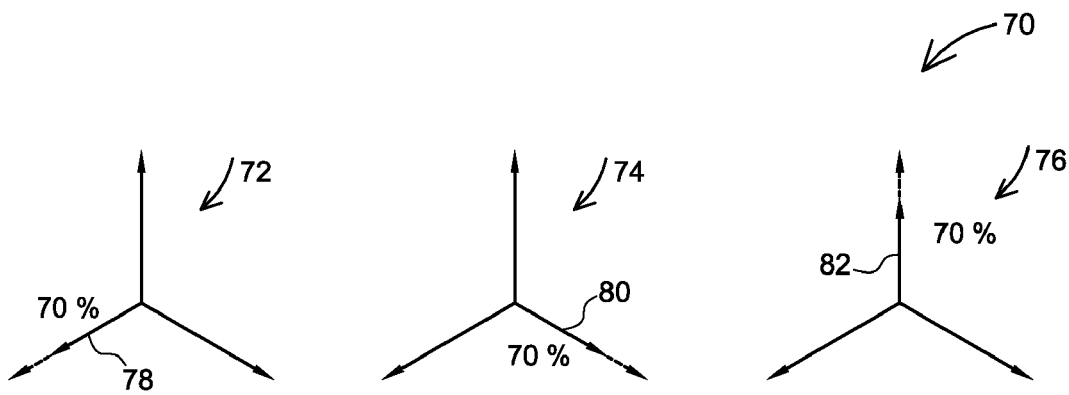
FIG. 3 illustrates an exemplary input power disturbance emulated by the test circuitry of FIG. 2.

FIG. 3 illustrates an exemplary input power disturbance 70 emulated by the test circuitry 40 of FIG. 2. In the illustrated embodiment, voltage dips of a three-phase system with neutral are tested. As represented by reference numerals 72, 74 and 76, each individual voltage dip 78, 80 and 82 for each of the three-phases with respect to the neutral is tested one phase at a time. In this exemplary embodiment, a voltage dip of about 70% with respect to the neutral is tested for each of the three-phases. As described with reference to FIG. 2, the plurality of switches 46 of the power inverter 18 may be controlled to emulate the input power disturbance 70.

Figure 4:
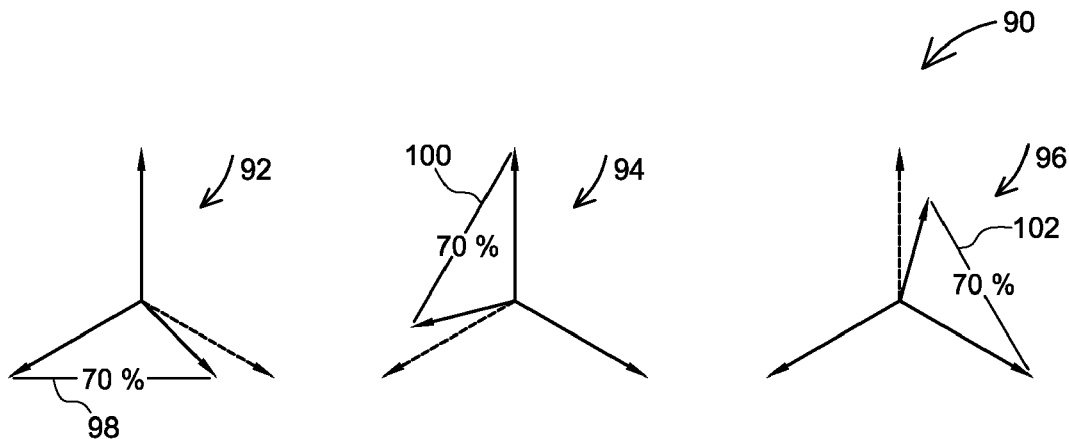
FIG. 4 illustrates another exemplary input power disturbance emulated by the test circuitry of FIG. 2.

FIG. 4 illustrates another exemplary input power disturbance 90 emulated by the test circuitry 40 of FIG. 2. In the illustrated embodiment, phase-to-phase voltage dips of a three-phase system are tested. As represented by reference numerals 92, 94 and 96, each individual phase shift 98, 100 and 102 for each of the three-phases is tested one phase at a time. As illustrated, each of the simulations 92, 94 and 96 includes a change in voltage amplitude of one phase of the output AC voltage and a magnitude of one phase angle. In this exemplary embodiment, the emulated phase-to-phase voltage sag is about 70%.

Figure 5:
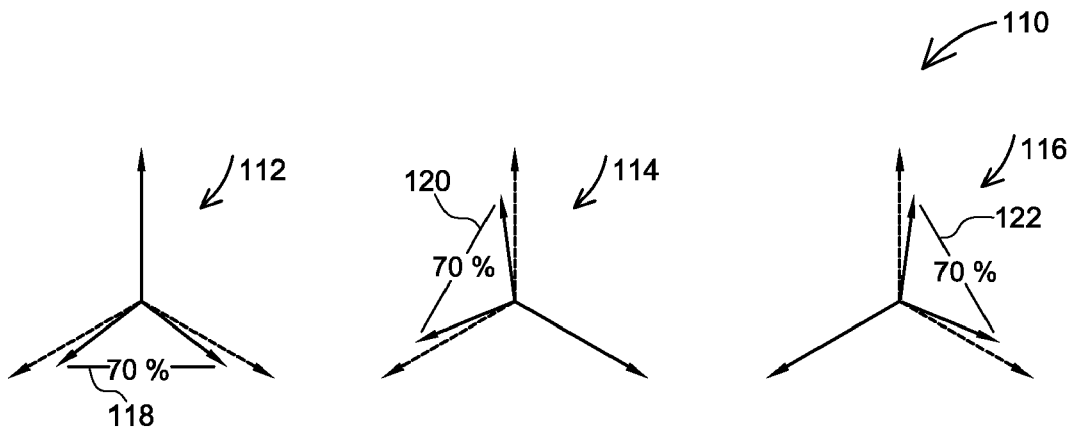
FIG. 5 illustrates another exemplary input power disturbance emulated by the test circuitry of FIG. 2.

FIG. 5 illustrates another exemplary input power disturbance 110 emulated by the test circuitry 40 of FIG. 2. As with the embodiment of FIG. 4, phase-to-phase voltage dips of the three-phase system are tested. As represented by reference numerals 112, 114 and 116, each individual phase-to-phase voltage sag 118, 120 and 122 for each of the three-phases is tested one phase at a time. In the illustrated embodiment, each of the tests 112, 114 and 116 includes a change in voltage amplitude of two phases of the output AC power and a magnitude of one phase angle. It should be noted that a plurality of other power disturbances may be emulated using the test circuitry of FIG. 1. For example, a frequency change for all phases of the output AC voltage may be emulated by controlling the power structure 14 (see FIG. 1) of the test circuitry 10. In particular, control signals may be applied to the power inverter 16 to emulate the desired input power disturbances.

Figure 6:
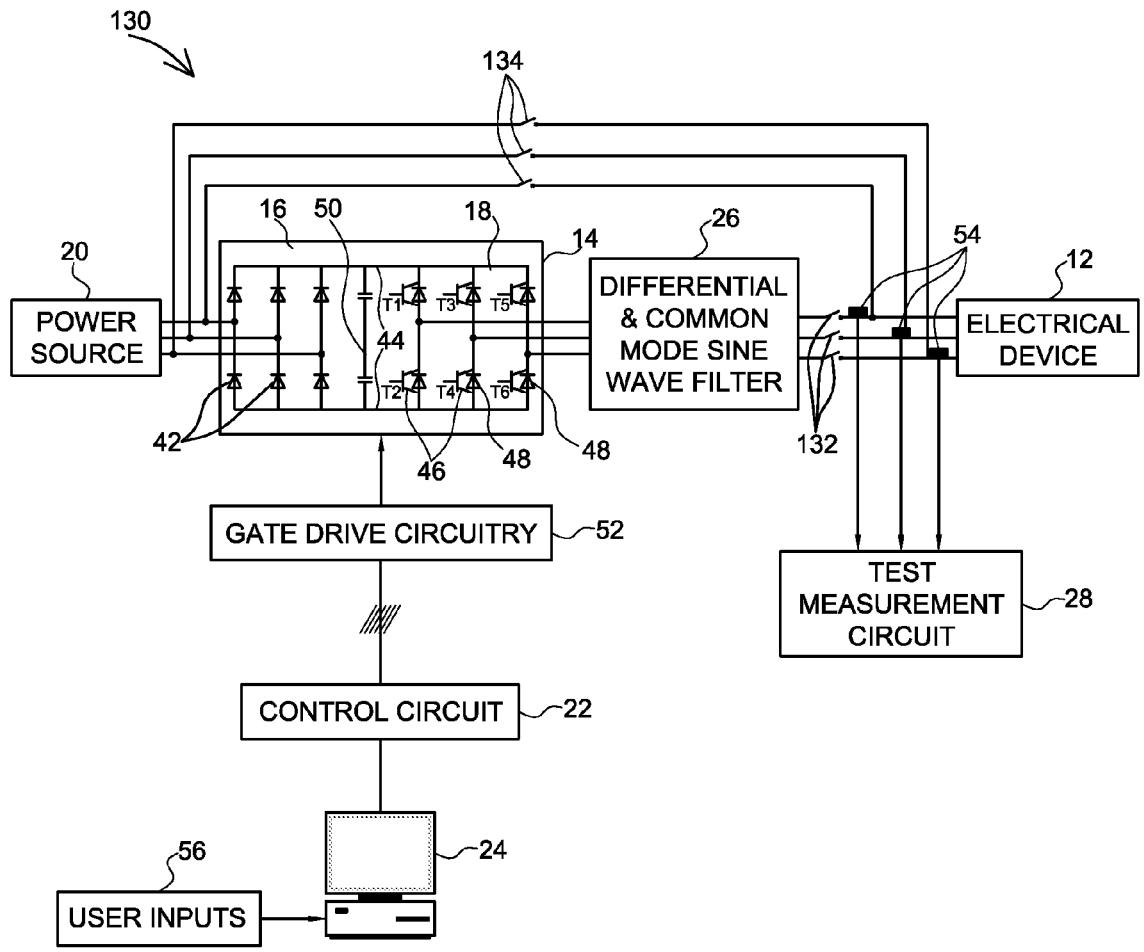
FIG. 6 illustrates another exemplary configuration of the test circuitry of FIG. 1 in accordance with aspects of the present invention.

FIG. 6 illustrates another exemplary configuration 130 of the test circuitry 10 of FIG. 1. As illustrated, the test circuitry 10 includes the power structure 14 with the rectifier 16 to convert incoming AC voltage from the power source 20 to DC voltage and the power inverter 18 to convert DC voltage to three-phase output AC voltage applied to the electrical device 12. As described above, the power structure 14 may be controlled via the control circuit 22 to emulate input power disturbances.

In this exemplary embodiment, the test circuitry 130 further includes output switches such as represented by reference numeral 132 on each of the three phases of the output AC power. Furthermore, the test circuitry 130 also includes bypass switches, such as represented by reference numeral 134 bypassing the power structure 14. The control circuit 22 is configured to apply control signals to the output switches 132 and to the bypass switches 134 that are controlled as described below to unlimit inrush current to the electric device 12.

The electrical device under test 12 is fed through this bypass switch 134 when emulating normal grid conditions. However, under abnormal voltage/frequency test conditions, the electrical device under test 12 is disconnected from the mains by switching off this bypass switch 134 and connected to the power inverter by switching on the static switch 132. When returning back to normal grid conditions, the electrical device under test 12 is supplied from the mains again. Thus the power inverter is disconnected, and the bypass switch is turned on. Therefore, the inrush current drawn by the equipment under test will be supplied by the mains not the power inverter.

Figure 7:
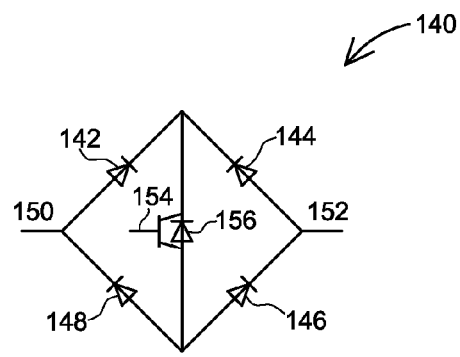
FIG. 7 is an exemplary configuration of the output switches/bypass switches employed in the test circuitry of FIG. 6.

FIG. 7 is an exemplary configuration 140 of the output switches 132/bypass switches 134 employed in the test circuitry 130 of FIG. 6. As illustrated, the switch 140 includes a diode bridge formed from diodes 142, 144, 146 and 148 between nodes 150 and 152 of the diode bridge. Further, the switch 134 includes an insulated-gate bipolar transistor (IGBT) 154/diode 156 pair in the center of the diode bridge. The use of such diode bridge as a switch is known in the art. In this embodiment, the operation of the switch is controlled through the control circuit 22 for emulating the desired power input disturbances.

Figure 8:
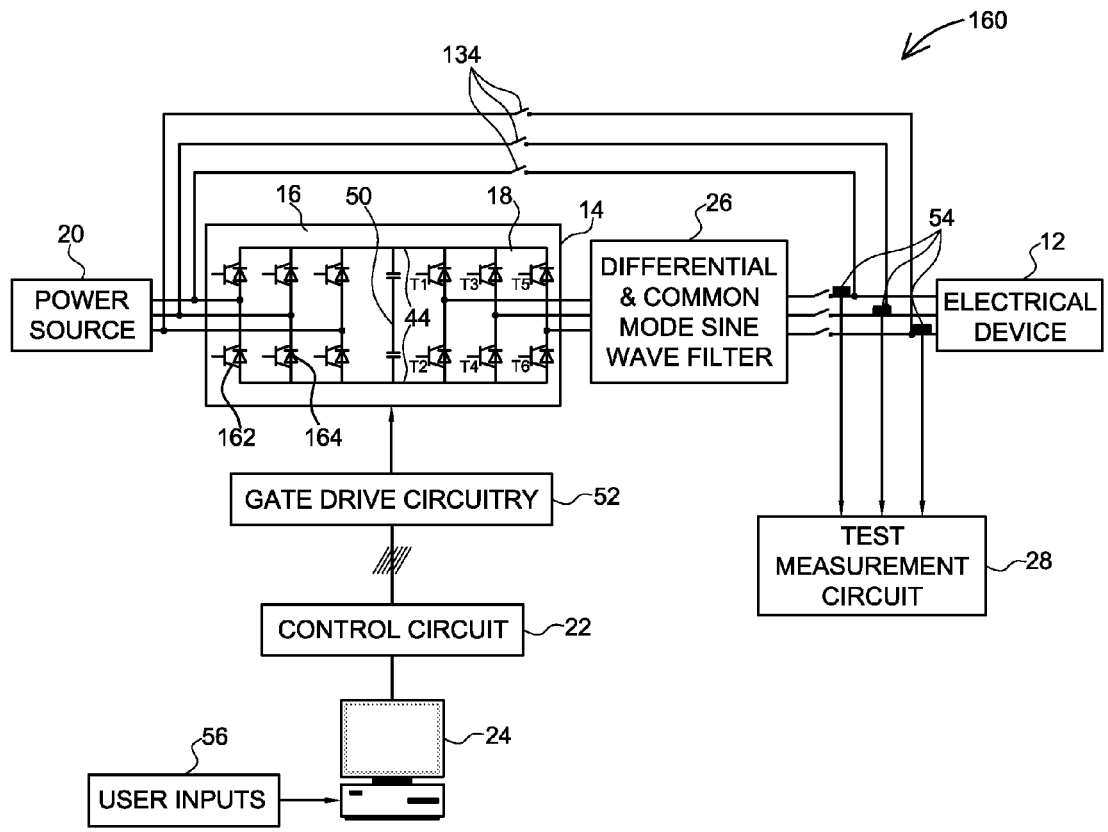
FIG. 8 illustrates an alternate configuration of the test circuitry of FIG. 6.

FIG. 8 illustrates an alternate configuration 160 of the test circuitry 130 of FIG. 6. As illustrated, the test circuitry 160 includes the power structure 14 with the power inverter 18 having the solid-switches 46 and the associated diodes 48 to emulate grid power disturbances. Further, the test circuitry 160 includes the output switches 132 and the bypass switches 134 which are controlled by the control circuit 22 to connect the electrical device 12 directly to the mains when returning back to normal grid conditions as described earlier. In the illustrated embodiment, the rectifier 16 of the test circuitry 160 includes a plurality of solid state switches such as represented by reference numeral 162 and associated diodes 164. The control circuit 22 is configured to apply control signals to the solid state switches 162 to boost the voltage of the DC bus 44 and/or to apply regenerated power back to the power source 20.

Figure 9:
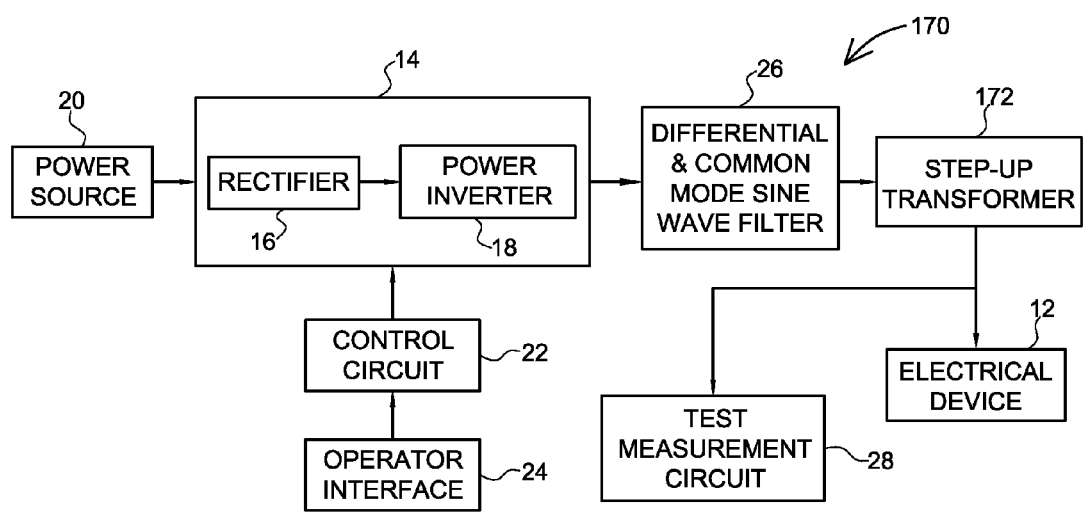
FIG. 9 illustrates an alternate configuration of the test circuitry 10 of FIG. 1 in accordance with aspects of the present invention.

FIG. 9 illustrates an alternate configuration 170 of the test circuitry 10 of FIG. 1. The test circuitry 170 includes the power structure 14 to emulate controlled voltage surges. In the illustrated embodiment, the test circuitry 170 includes a step-up transformer 172 configured to step up the voltage of the AC output voltage from the power structure 14.

The various aspects of the structures described hereinabove may be used for testing of electrical devices such as AC electrical drives. As described above, the technique utilizes a power structure to emulate grid power disturbances such as voltage sags, frequency changes and so forth. The technique described above employs a transformer-less design for the test circuitry that has a reduced size and low manufacturing costs and can be utilized for emulating a variety of power disturbances such as voltage sags/surges, voltage unbalance, frequency/angle disturbances. Advantageously, the technique enhances the reliability of the product and reduces manpower required for testing the electrical devices and provides reduced time to market.

While only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. Electrical power quality test circuitry for testing response of an electrical device to input power disturbances, comprising:
    a power structure comprising a rectifier configured to convert incoming AC voltage to DC voltage on a DC bus, and a power inverter configured to convert DC voltage from the DC bus to three-phase output AC voltage to the electrical device; and
    a control circuit configured to apply control signals to at least the power inverter to emulate at least a change in a phase angle of one phase of the output AC voltage with respect to at least one other phase of the output AC voltage.

2. The circuitry of claim 1, wherein the control circuit comprises gate drive circuitry configured to apply the control signals to a plurality of solid-state switches of the power inverter.

3. The circuitry of claim 1, wherein the rectifier comprises a plurality of solid state switches, and wherein the control circuit is configure to apply control signals to the solid state switches to boost the voltage of the DC bus and/or to apply regenerated power back to a power source.

4. The circuitry of claim 1, comprising output switches on each of the three phases of the output AC voltage, and bypass switches bypassing the power structure, wherein the control circuit is configured to apply control signals to the output switches and to the bypass switches to enhance inrush current withstanding capability of the test fixture.

5. The circuitry of claim 1, further comprising an integrated differential and common mode sine wave filter that substantially eliminates higher order harmonics associated with the inverter switching action from the output AC voltage.

6. The circuitry of claim 5, further comprising a test measurement circuit configured to measure currents and/or voltages of the three-phase output AC power.

7. The circuitry of claim 1, further comprising a step-up transformer configured to step up the voltage of the AC output power.

8. The circuitry of claim 1, wherein the control circuit is further configured to apply control signals to the power inverter to emulate a negative sequence output AC voltage.

9. The circuitry of claim 1, wherein the control circuit is further configured to emulate a grid voltage that has low order time harmonics supplying the electrical device under test.

10. The circuitry of claim 1, further comprising an operator interface configured to provide user inputs for generating the control signals for the power structure.

11. The circuitry of claim 1, wherein the control circuit is further configured to emulate an unbalance in the voltage applied to the electrical device under test.

12. The circuitry of claim 1, further comprising an integrated sinewave differential mode and common mode filter coupled to the power structure, wherein the filter is configured to filter out high switching frequencies associated with the inverter operation.

13. A method for testing response of an electrical device to input power disturbances, comprising:
   operating a power structure to convert incoming AC voltage to DC voltage and to convert the DC voltage to three-phase output AC voltage; and
   controlling at least one of a rectifier and a power inverter of the power structure to emulate at least a change in a phase angle of one phase of the output AC voltage with respect to at least one other phase of the output AC voltage.

14. The method of claim 13, wherein controlling the power inverter comprises:
   generating control signals based upon user inputs for emulating the power disturbances; and
   applying control signals to a plurality of solid-state switches of the power inverter.

15. The method of claim 14, further comprising regenerating power back to a power source by controlling a plurality of solid state switches of the rectifier.

16. The method of claim 15, further comprising boosting the voltage of the DC bus by controlling the plurality of solid state switches of the rectifier.

17. The method of claim 13, further comprising selectively operating output switches on each of the three phases of the output AC power and bypass switches bypassing the rectifier and the power inverter to unlimit inrush current drawn by the electrical device under test.

18. Electrical power quality test circuitry for testing response of an electrical device to input power disturbances, comprising:
   a power structure comprising a rectifier configured to convert incoming AC voltage to DC voltage on a DC bus, and a power inverter configured to convert DC voltage from the bus to three-phase output AC voltage to the electrical device;
   an operator interface configured to provide user inputs corresponding to the input power disturbances;
   a control circuit configured to generate control signals based upon the user inputs and to apply control signals to at least one of the power inverter and to the rectifier to emulate the power disturbances and/or to apply regenerated power back to a power source.

19. The circuitry of claim 18, wherein the power inverter comprises a plurality of solid state switches and wherein the control circuit is configured to apply the control signals to the switches to emulate at least one of a change in the amplitude of at least one phase of the output AC voltages, at least one phase angle of at least one phase of the output AC voltages, and a frequency change for all phases of the output AC voltages.

20. The circuitry of claim 18, wherein the rectifier comprises a plurality of solid state switches and the control circuit is configured to apply the control signals to the switches to boost the voltage of the DC bus and/or to apply regenerated power back to the power source.

21. Electrical power quality test circuitry for testing response of an electrical device to input power disturbances, comprising:
   a power structure comprising a rectifier configured to convert incoming AC voltage to DC voltage on a DC bus, and a power inverter configured to convert DC voltage from the DC bus to three-phase output AC voltage to the electrical device;
   a control circuit configured to apply control signals to at least the power inverter to emulate at least one of a change in voltage amplitude of at least one phase of the output AC voltage, at least one phase angle of at least one phase of the output AC voltage, and a frequency change for all phases of the output AC voltage; and
   output switches on each of the three phases of the output AC voltage, and bypass switches bypassing the power structure, wherein the control circuit is configured to apply control signals to the output switches and to the bypass switches to enhance inrush current withstanding capability of the test fixture.

22. Electrical power quality test circuitry for testing response of an electrical device to input power disturbances, comprising:
   a power structure comprising a rectifier configured to convert incoming AC voltage to DC voltage on a DC bus, and a power inverter configured to convert DC voltage from the DC bus to three-phase output AC voltage to the electrical device;
   a control circuit configured to apply control signals to at least the power inverter to emulate at least one of a change in voltage amplitude of at least one phase of the output AC voltage, at least one phase angle of at least one phase of the output AC voltage, and a frequency change for all phases of the output AC voltage; and an integrated differential and common mode sine wave filter that substantially eliminates higher order harmonics associated with the inverter switching action from the output AC voltage.

23. Electrical power quality test circuitry for testing response of an electrical device to input power disturbances, comprising:
- a power structure comprising a rectifier configured to convert incoming AC voltage to DC voltage on a DC bus, and a power inverter configured to convert DC voltage from the DC bus to three-phase output AC voltage to the electrical device; and
- a control circuit configured to apply control signals to at least the power inverter to emulate at least one of a change in voltage amplitude of at least one phase of the output AC voltage, at least one phase angle of at least one phase of the output AC voltage, and a frequency change for all phases of the output AC voltage;

wherein the control circuit is further configured to emulate a grid voltage that has low order time harmonics supplying the electrical device under test.

* * * * *